(12) United States Patent
Wu

(10) Patent No.: US 11,798,313 B2
(45) Date of Patent: Oct. 24, 2023

(54) FINGERPRINT IDENTIFICATION MODULE AND ELECTRONIC DEVICE

(71) Applicant: VIVO MOBILE COMMUNICATION CO., LTD., Guangdong (CN)

(72) Inventor: Huaping Wu, Guangdong (CN)

(73) Assignee: VIVO MOBILE COMMUNICATION CO., LTD, Guangdong (CN)

( * ) Notice: Subject to any disclaimer, the term of this patent is extended or adjusted under 35 U.S.C. 154(b) by 0 days.

(21) Appl. No.: 17/686,158

(22) Filed: Mar. 3, 2022

(65) Prior Publication Data

US 2022/0270390 A1    Aug. 25, 2022

Related U.S. Application Data

(63) Continuation of application No. PCT/CN2020/103565, filed on Jul. 22, 2020.

(30) Foreign Application Priority Data

Sep. 20, 2019   (CN) .......................... 201910891558.6

(51) Int. Cl.
*G06V 40/13* (2022.01)
*G06V 40/12* (2022.01)
(Continued)

(52) U.S. Cl.
CPC ...... *G06V 40/1318* (2022.01); *G06V 40/1341* (2022.01); *H10K 59/40* (2023.02); *H10K 59/65* (2023.02)

(58) Field of Classification Search
CPC ........... G06V 40/1318; G06V 40/1341; G06V 10/143; G06V 40/1324; G06V 10/147;
(Continued)

(56) References Cited

U.S. PATENT DOCUMENTS

2004/0001617 A1    1/2004 Blume
2013/0001409 A1*  1/2013 Tsukagoshi ....... H01L 31/02162
                                                            250/226
(Continued)

FOREIGN PATENT DOCUMENTS

CN         1084648 A      3/1994
CN       102402679 A      4/2012
(Continued)

OTHER PUBLICATIONS

The First Office Action of Priority Application No. CN 201910891558.6 issued by the Chinese Patent Office dated Mar. 12, 2021.
(Continued)

*Primary Examiner* — Premal R Patel
(74) *Attorney, Agent, or Firm* — IP & T GROUP LLP

(57) ABSTRACT

A fingerprint identification module includes a lens, an optical sensor, and a light filtering component located between the lens and the optical sensor, where a thickness of an edge area of the light filtering component is greater than a thickness of a central area of the light filtering component, and a thickness of the light filtering component decreases gradually along a direction from the edge area to the central area.

18 Claims, 6 Drawing Sheets

(51) Int. Cl.
*H10K 59/40* (2023.01)
*H10K 59/65* (2023.01)

(58) Field of Classification Search
CPC ........ H10K 59/40; H10K 59/65; G06F 21/32; G06Q 20/40145
See application file for complete search history.

(56) References Cited

U.S. PATENT DOCUMENTS

| | | |
|---|---|---|
| 2014/0355136 A1 | 12/2014 | Liou et al. |
| 2015/0241692 A1 | 8/2015 | Lin |
| 2018/0076242 A1* | 3/2018 | Hsieh ................ H01L 27/14627 |
| 2019/0265440 A1 | 8/2019 | Tabata |
| 2020/0026903 A1 | 1/2020 | Hai et al. |
| 2020/0042765 A1* | 2/2020 | Lee .................... G06V 40/1359 |
| 2020/0203404 A1* | 6/2020 | Lee .................... H01L 27/14621 |
| 2022/0319225 A1* | 10/2022 | Yeh .................... H01L 27/14623 |

FOREIGN PATENT DOCUMENTS

| | | |
|---|---|---|
| CN | 102510447 A | 6/2012 |
| CN | 102856396 A | 1/2013 |
| CN | 103543512 A | 1/2014 |
| CN | 105335693 A | 2/2016 |
| CN | 106022325 A | 10/2016 |
| CN | 107544109 A | 1/2018 |
| CN | 108226120 A | 6/2018 |
| CN | 207663128 U | 7/2018 |
| CN | 108399352 A | 8/2018 |
| CN | 207751589 U | 8/2018 |
| CN | 108921005 A | 11/2018 |
| CN | 108985235 A | 12/2018 |
| CN | 109284734 A | 1/2019 |
| CN | 208796257 U | 4/2019 |
| CN | 109840460 A | 6/2019 |
| CN | 109975953 A | 7/2019 |
| CN | 209086953 U | 7/2019 |
| CN | 110196482 A | 9/2019 |
| CN | 110235143 A | 9/2019 |
| CN | 110751047 A | 2/2020 |
| TW | M569426 U | 11/2018 |

OTHER PUBLICATIONS

The Second Office Action of Priority Application No. CN 201910891558.6 issued by the Chinese Patent Office dated Jun. 9, 2021.
International Search Report and Written Opinion of International Application No. PCT/CN2020/103565 issued by the Chinese Patent Office dated Oct. 22, 2020.

* cited by examiner

FINGERPRINT IDENTIFICATION MODULE AND ELECTRONIC DEVICE

CROSS REFERENCE TO RELATED APPLICATIONS

This application is a Bypass Continuation Application of PCT/CN2020/103565 filed on Jul. 22, 2020, which claims priority to Chinese Patent Application No. 201910891558.6 filed on Sep. 20, 2019, which are incorporated herein by reference in their entirety.

TECHNICAL FIELD

Embodiments of the present invention relate to the field of communications technologies, and in particular, to a fingerprint identification module and an electronic device.

BACKGROUND

With the continuous development of terminal technologies, electronic devices are applied more and more widely. In order to protect information security of a user, a fingerprint identification function is increasingly commonly used on the electronic devices. For example, it is used for mobile phone unlocking, mobile payment (such as payment and transfer), and the like.

SUMMARY

According to a first aspect, an embodiment of the present invention provides a fingerprint identification module, where the fingerprint identification module includes a lens, an optical sensor, and a light filtering component located between the lens and the optical sensor, the thickness of an edge area of the light filtering component is greater than the thickness of a central area of the light filtering component, and the thickness of the light filtering component decreases gradually along the direction from the edge area to the central area.

According to a second aspect, an embodiment of the present invention provides an electronic device, where the electronic device includes the fingerprint identification module according to the foregoing first aspect.

DESCRIPTION OF EMBODIMENTS

Figure 1:
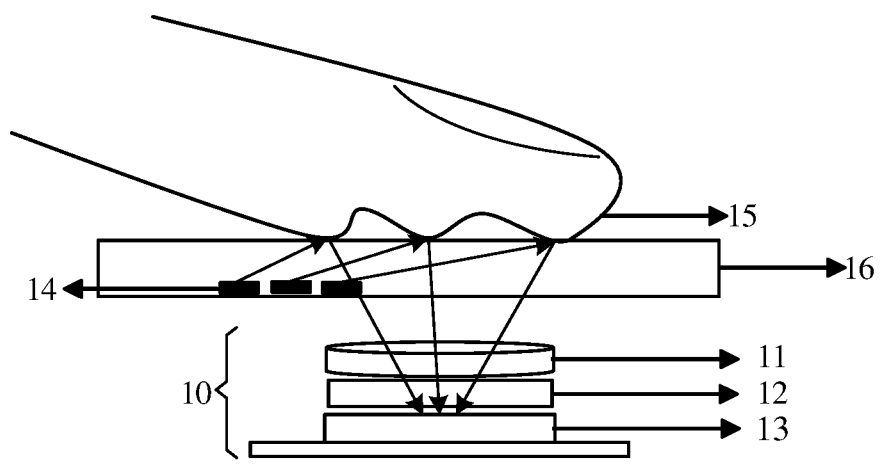
FIG. 1 is a schematic structural diagram of a fingerprint identification module applied to an electronic device.

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention shall fall within the protection scope of this application.

The term "and/or" in this specification describes an association relationship of associated objects, indicating that three relationships may exist. For example, A and/or B may indicate three cases: only A exists, both A and B exist, and only B exists. A character "/" in this specification indicates an "or" relationship between associated objects. For example, AB indicates A or B.

In the specification and claims of the present invention, the terms such as "first" and "second" are used to distinguish between different objects, but are not used to describe a particular sequence of the objects. For example, a first substrate, a second substrate, and the like are used to distinguish between different substrates, but are not used to describe a particular sequence of the substrates.

In the embodiments of the present invention, the term such as "exemplary" or "for example" is used to indicate an example, an instance, or a description. Any embodiment or design solution described as "exemplary" or "for example" in the embodiments of the present invention should not be construed as being more preferred or advantageous than other embodiments or design solutions.

In the description of the embodiments of the present invention, unless otherwise specified, the meaning of "a plurality of" means two or more. For example, a plurality of processing units mean two or more processing units, and a plurality of elements mean two or more elements.

In the embodiments of the present invention, unless expressly specified and limited otherwise, the terms "connected to each other" and "connected to" should be understood in a broad sense. For example, "connection" may be a fixed connection, a detachable connection, or an integral connection; or may be a direct connection or an indirect connection by means of an intermediate medium. For a person of ordinary skill in the art, meanings of the foregoing terms in the present invention may be understood based on situations.

With the rapid development of electronic devices, a photoelectric fingerprint identification technology under an organic light-emitting diode (OLED) screen has become a new direction of a fingerprint identification technology. A basic principle of the optical fingerprint identification technology under the OLED screen is generally: an organic luminescent source (also referred to as a pixel light source) of the OLED screen is used as a light source (namely, a complementary light source) for fingerprint texture imaging. A light ray emitted from the light source reaches a finger after passing through a panel of the OLED screen and a glass cover plate and is then reflected by the finger to the fingerprint identification module (the fingerprint identification module may include a lens, a light filter, and a sensor), and then the fingerprint identification module generates fingerprint texture images with different gray levels by utilizing a difference between fingerprint peaks and fingerprint valleys in a light ray reflection intensity.

At present, a principle of a photoelectric fingerprint identification technology used by an electronic device is as follows: light emitted from the OLED screen of the electronic device passes through an optical lens and a light filter after being reflected by a finger on a display screen and is then transmitted to an optical sensor in the electronic device. The optical sensor may generate images with different gray levels by sensing a difference between fingerprint ridges and fingerprint valleys in a light reflection intensity, that is, generate fingerprint texture images. Then, the electronic device may perform fingerprint identification by recognizing the fingerprint texture images.

However, when light rays that reach the optical sensor after being reflected by the finger are non-uniformly distributed on the optical sensor, there may be a relatively great difference in intensities of light received by the optical sensor in different areas. As a result, fingerprint images collected by the optical sensor in different areas have low quality equilibrium, resulting in a low success rate of fingerprint identification.

Figure 2:
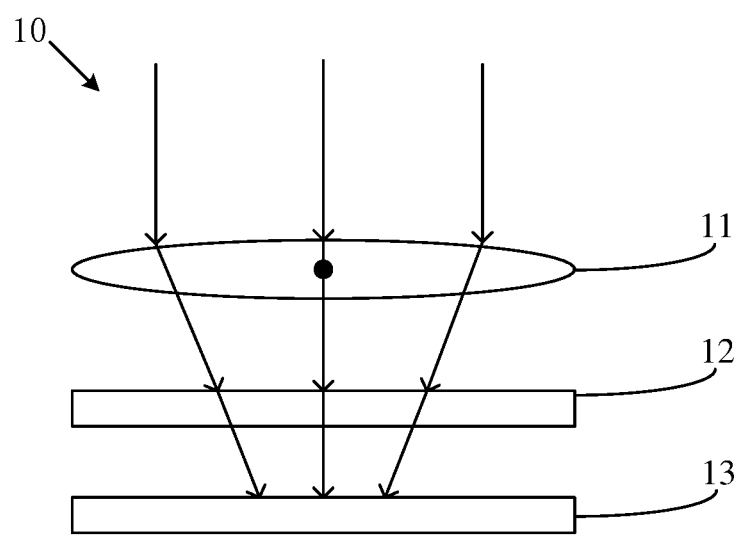
FIG. 2 is a schematic diagram of light paths of light rays that pass through the fingerprint identification module in FIG. 1 after being reflected by a finger.

FIG. 1 is a schematic structural diagram of a fingerprint identification module 10 applied to an electronic device. FIG. 2 is a schematic diagram of light paths of light rays that pass through the fingerprint identification module in FIG. 1 after being reflected by a finger. As shown in FIG. 1, the fingerprint identification module 10 includes a lens 11, a light filter 12, and a sensor 13. After being reflected by a finger 15, a light ray (also referred to as a light signal) emitted from a light source 14 reaches the sensor 13 (also referred to as a pixel sensor) after passing through a panel 16, the lens 11, and the light filter 12 in sequence. The sensor 13 converts the light signal into an electric signal, to generate fingerprint texture images with different gray levels. Then, the electronic device may perform fingerprint identification by recognizing the fingerprint texture images.

However, in a conventional light filter shown in FIG. 2, the center of the light filter is aligned with an edge of the light filter. Light rays that reach the sensor 13 after being reflected by a finger and passing through the lens and the light filter may be non-uniformly distributed on the sensor 13, that is, most of the light rays may be concentrated in a middle area of a sensing area of the sensor 13, and few light rays reach an edge area of the sensing area of the sensor 13. In a case that the light rays that reach the sensor after being reflected by the finger are non-uniformly distributed on the sensor, there may be a relatively great difference in intensities of light received by the sensor in different areas, resulting a high brightness in the middle area and a low brightness in the edge area. As a result, fingerprint images collected by the sensor in different areas have low quality equilibrium, resulting in a relatively low success rate of fingerprint identification.

In view of this, the embodiments of the present invention provide a fingerprint identification module and an electronic device. The fingerprint identification module includes a lens, an optical sensor, and a light filtering component located between the lens and the optical sensor. An incident direction of a first light ray that enters the light filtering component is different from a refractive direction of the first light ray. The first light ray is any light ray that is of light rays entering the light filtering component and that is different from a second light ray, and the second light ray is a light ray in a normal direction of the light filtering component. In this solution, the fingerprint identification module uses a novel light filtering component. The light filtering component has not only a light filtering function, but also a function of adjusting a propagation direction of light rays that enter the light filtering component. In this way, light rays that reach the optical sensor after being reflected by a finger may be uniformly distributed on the sensor, that is, intensities of light received by the optical sensor in different areas are made approximately the same. Therefore, the embodiments of the present invention can improve quality equilibrium of fingerprint images collected by the optical sensor in different areas, and can increase a success rate of fingerprint identification.

The following describes the fingerprint identification module provided in the embodiments of the present invention by using examples with reference to the accompanying drawings.

Figure 3:
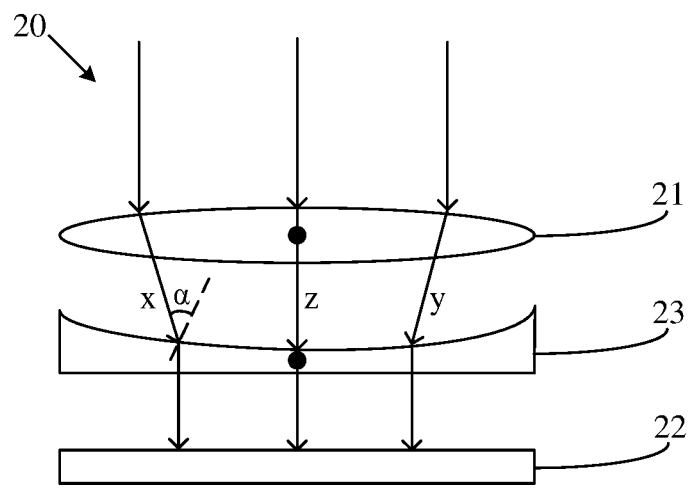
FIG. 3 is a first schematic structural diagram of a light filtering component in a fingerprint identification module according to an embodiment of the present invention.

As shown in FIG. 3, an embodiment of the present invention provides a fingerprint identification module 20. The fingerprint identification module 20 may include: a lens 21, an optical sensor 22, and a light filtering component 23 located between the lens 21 and the optical sensor 22. The thickness of an edge area of the light filtering component 23 is greater than the thickness of a central area of the light filtering component 23, and the thickness of the light filtering component 23 decreases gradually along the direction from the edge area to the central area.

From the perspective of incident angles and emergent angles of a light ray that enters the light filtering component, an incident direction of the light ray is different from a refractive direction of the light ray. The light ray is a light ray that is of light rays entering the light filtering component and that is different from an axial light ray (namely, a light ray in a normal direction of the light filtering component).

In this embodiment of the present invention, the fingerprint identification module 2 is a photoelectric fingerprint identification module.

In this embodiment of the present invention, the foregoing lens may be a convex lens, or may be a lenses group that is composed of a plurality of lenses and that has a light ray converging function. The lens may be used to collect a light ray reflected by a finger (hereinafter may be referred to as a light signal), and transmit the light signal to the light filtering component.

In this embodiment of the present invention, the foregoing light filtering component may be used to receive a light signal transmitted through the lens, perform light filtering processing and light regulation processing on the received light signal, and transmit the processed light signal to the optical sensor. The light filtering component may allow visible light with wavelengths ranging from approximately 400 nm to 610 nm to pass through, and may filter out light in another wavelength band (that is, perform the foregoing light filtering processing). Certainly, in another embodiment, the light filtering component may alternatively allow light in another wavelength band to pass through based on situations, or may filter out visible light, which is not limited in the present invention.

In this embodiment of the present invention, the foregoing optical sensor may be used to receive the processed light signal and convert the processed light signal into an electric signal, so as to generate fingerprint texture images.

The following describes the fingerprint identification module provided in this embodiment of the present invention from the following two aspects separately: the light regulation processing and the light filtering processing of the light filtering component.

Light regulation processing of the light filtering component is as follows.

With reference to FIG. 3, the following uses examples to describe an implementation of performing light regulation processing on light rays by the light filtering component in the fingerprint identification module provided in this embodiment of the present invention.

As shown in FIG. 3, incident light rays that enter the light filtering component 23 may include a light ray x, a light ray y, and a light ray z. It is assumed that the light ray z is a light ray in a normal direction of the light filtering component 23. For ease of description, the light rays such as the light ray x and the light ray y may be referred to as a first light ray, and the light ray z may be referred to as a second light ray. In other words, the first light ray may be any light ray that is of light rays entering the light filtering component and that is different from the second light ray.

As shown in FIG. 3, the first light ray (for example, the light ray x or the light ray y) that enters the light filtering component 23 is refracted by the light filtering component 23. In other words, after the first light ray passes through the light filtering component 23, an emergent direction (namely, a refractive direction) of the first light ray is different from an incident direction of the first light ray, that is, a transmission direction of the first light ray is changed.

As shown in FIG. 3, the second light ray (namely, the light ray z) enters the light filtering component 23 in a normal direction of the light filtering component 23. After the second light ray penetrates the light filtering component 23, an emergent direction of the second light ray is the same as an incident direction of the second light ray, that is, a transmission direction of the second light ray is not changed.

Optionally, in this embodiment of the present invention, an incident angle of the foregoing first light ray may be greater than a refractive angle of the first light ray. For example, as shown in FIG. 3, the incident angle of the first light ray (for example, the light ray x) that enters the light filtering component 23 is α degrees (α is greater than 0), and the refractive angle of the first light ray is 0 degrees, that is, the incident angle of the first light ray is greater than the refractive angle of the first light ray.

It should be noted that, the foregoing description is provided by using an example in which the first light ray is one light ray (for example, the light ray x or the light ray y). It may be understood that, during actual implementation, a large number of light rays (including the first light ray and the second light ray) that enter the light filtering component 23 may constitute a light beam.

Optionally, in this embodiment of the present invention, incident rays are emitted as a parallel beam of rays after passing through the foregoing lens and the foregoing light filtering component. In other words, the foregoing beam of rays emitted from the light filtering component may be a parallel beam of rays. As shown in FIG. 3, when a light beam that enters the light filtering component 23 is a convergent light beam, the beam of rays emitted from the light filtering component 23 may be a parallel beam of rays.

In this way, parallel light rays that reach the optical sensor may be uniformly distributed on the sensor, so that intensities of light received by the optical sensor in different areas are approximately the same. Therefore, this embodiment of the present invention can improve quality equilibrium of fingerprint images collected by the optical sensor in different areas, and can increase a success rate of fingerprint identification.

In this embodiment of the present invention, the foregoing light filtering component includes a light filtering layer. The light filtering layer may be used to perform light filtering processing on light rays reflected by a finger. At least one of the surface of the light filtering layer facing the lens and the surface of the light filtering layer facing away from the lens is concave.

Optionally, in this embodiment of the present invention, the foregoing light filtering component may further include a light adjusting member, and in the case where the fingerprint identification module is in the working state, at least one of the first surface of the light adjusting member facing the lens and the second surface of the light adjusting member facing away from the lens is concave. For example, the first surface of the light adjusting member may be concave; or the second surface of the light adjusting member may be concave; or both the first surface and the second surface of the light adjusting member may be concave.

Optionally, in this embodiment of the present invention, the light filtering layer may be disposed on the surface of the light adjusting member, or may be disposed in a manner of being spaced with the light adjusting member at a specific interval. This may be determined according to an actual usage requirement, and is not limited in this embodiment of the present invention.

Optionally, in this embodiment of the present invention, the light adjusting member may be a concave glass lens or a liquid crystal lens (namely, a liquid crystal layer), which may be determined according to an actual usage requirement, and is not limited in this embodiment of the present invention.

It may be understood that, in this embodiment of the present invention, the light filtering layer structure in the light filtering component may be improved (for example, the light filtering layer may be designed as a light filter with a concave surface), to implement light regulation processing of light rays; or the light filtering layer may be combined with another light adjusting member (for example, a concave glass lens or a liquid crystal lens), to implement light regulation processing of light rays. The following uses a first implementation, a second implementation, and a third implementation as follows as examples to describe a possible implementation of hardware of the light filtering component provided in this embodiment of the present invention.

First Implementation:

in the first implementation, the foregoing light filtering component may be a light filtering layer, and at least one of the surface of the light filtering layer facing the lens and the surface of the light filtering layer facing away from the lens is a concave. The following describes implementations separately.

(1) As shown in FIG. 3, the light filtering component 23 may be designed as a light filtering layer with a concave surface. The surface of the light filtering layer facing the lens may be curved (namely, concave) and curves towards the inside of the light filtering component 23.

Figure 4:
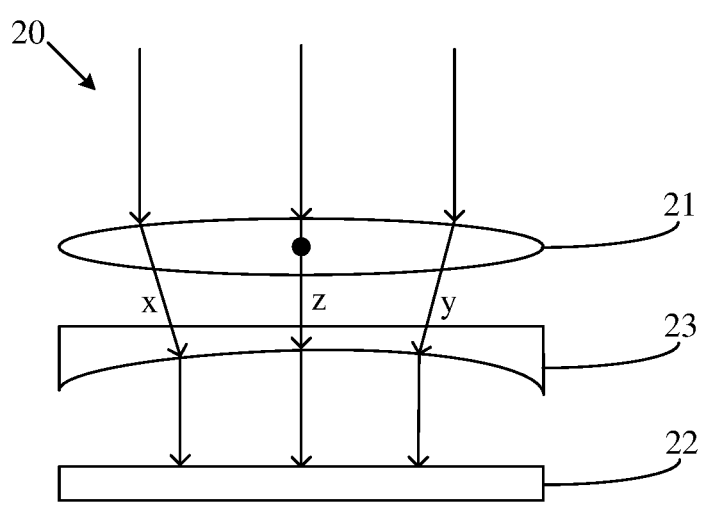
FIG. 4 is a second schematic structural diagram of a light filtering component in a fingerprint identification module according to an embodiment of the present invention.

(2) As shown in FIG. 4, the light filtering component 23 may be designed as a light filtering layer with a concave surface. The surface of the light filtering layer facing away from the lens may be curved (namely, concave) and curves towards the inside of the light filtering component 23.

Figure 5:
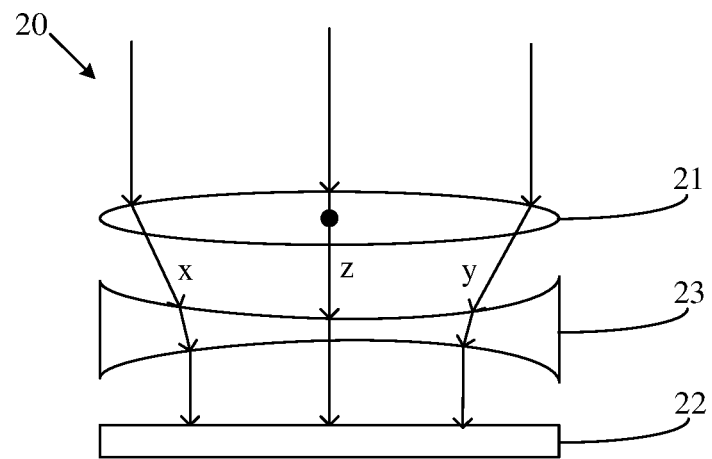
FIG. 5 is a third schematic structural diagram of a light filtering component in a fingerprint identification module according to an embodiment of the present invention.

(3) As shown in FIG. 5, the light filtering component 23 may be designed as a light filtering layer with a concave surface. Both the surface of the light filtering layer facing the lens and the surface of the light filtering layer facing away from the lens may be curved (namely, concave) and curve towards the inside of the light filtering component 23.

With reference to the foregoing implementations (1), (2), and (3), the light filtering component is in a form of a concave lens from the center to the edge. In addition to performing light filtering processing on light rays, the light filtering component can make light rays converged by the lens become a parallel beam of rays after the light rays pass through the light filtering component. In this way, a brightness difference between a middle area and an edge area of the optical sensor can be guaranteed. In addition, when a brightness in the middle area of the optical sensor is not too high, a brightness in the edge area is increased, so that quality equilibrium of fingerprint imaging of the optical sensor in different areas can be improved.

In this solution, according to an actual usage requirement, the light filtering layer may be designed to have different thicknesses and concave radians, so as to ensure that light rays can reach the optical sensor uniformly and parallelly after passing through the light filtering layer, which not only guarantees a proper fingerprint image brightness in the central area, but also increases a fingerprint image brightness in the edge area.

Second Implementation:
in the second implementation, the foregoing light filtering component may include a light filtering layer and a concave glass lens (namely, a light adjusting member). The light filtering layer may be disposed on one side of the concave glass lens.

Optionally, the light filtering layer may be disposed on the surface of the concave glass lens, or may be disposed in a manner of being spaced with the concave glass lens at a specific interval.

Third Implementation:
in the third implementation, the foregoing light filtering component may include a light filtering layer and a liquid crystal lens (namely, a light adjusting member). The light filtering layer may be disposed on one side of the liquid crystal lens.

Optionally, the light filtering layer may be disposed on the surface of the liquid crystal lens, or may be disposed in a manner of being spaced with the liquid crystal lens at a specific interval.

Optionally, in this embodiment of the present invention, the light filtering component may further include a first substrate and a second substrate, and the foregoing liquid crystal lens may be disposed between the first substrate and the second substrate.

Figure 6:
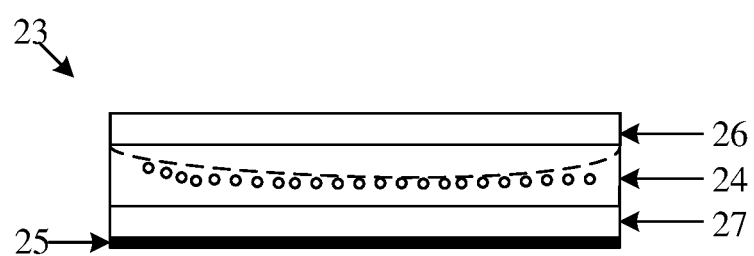
FIG. 6 is a fourth schematic structural diagram of a light filtering component in a fingerprint identification module according to an embodiment of the present invention.

FIG. 6 is a schematic structural diagram of a light filtering component according to an embodiment of the present invention. As shown in FIG. 6, the light filtering component 23 includes a liquid crystal lens 24, a light filtering layer 25, a first substrate 26, and a second substrate 27. The liquid crystal lens 24 is disposed between the first substrate 26 and the second substrate 27. The light filtering layer 25 may be disposed on an outer surface of the first substrate 26, or the light filtering layer 25 may be disposed on an outer surface of the second substrate 27.

In this embodiment of the present invention, the foregoing first substrate and second substrate may be glass substrates, or may be made of any other materials that meet an actual usage requirement, which may be determined according to an actual usage requirement, and is not limited in this embodiment of the present invention.

In this embodiment of the present invention, the foregoing light filtering layer may be disposed on the surface of the first substrate or the surface of the second substrate in a plating manner; or may be disposed on the surface of the first substrate or the surface of the second substrate in a bonding manner; or may be disposed in any other manners that meet an actual usage requirement, which may be determined according to an actual usage requirement, and is not limited in this embodiment of the present invention.

Optionally, in this embodiment of the present invention, the foregoing fingerprint identification module may further include a control module connected to the liquid crystal lens, and the control module may control liquid crystal deflection in the liquid crystal lens.

Optionally, in this embodiment of the present invention, the first substrate and/or the second substrate are provided with an electrically conductive wire, and the foregoing liquid crystal lens is electrically connected to the electrically conductive wire. For example, the first substrate and/or the second substrate may be provided with a flexible printed circuit (FPC) in a wiring manner. The control module may control, by using the FPC provided on the first substrate and the second substrate, liquid crystal molecules in the liquid crystal lens to move and deflect, to make the liquid crystal lens distributed in a shape of a concave lens. By controlling movement and deflection of the liquid crystal molecules, adjustment of any thickness and radian in any area can be achieved, which is more flexible. In this way, it can be ensured that light rays can reach the optical sensor uniformly and parallelly after passing through the light filtering layer, which not only guarantees a proper fingerprint image brightness in a central area, but also increases a fingerprint image brightness in an edge area.

According to the foregoing light filtering component provided in this embodiment of the present invention, a propagation direction of light rays that enter the light filtering component can be adjusted. In this way, light rays that reach the optical sensor after being reflected by a finger may be uniformly distributed on the sensor, that is, intensities of light received by the optical sensor in different areas are made approximately the same. Therefore, this embodiment of the present invention can improve quality equilibrium of fingerprint images collected by the optical sensor in different areas, and can increase a success rate of fingerprint identification.

Light filtering processing of the light filtering component is as follows.

At present, a light filtering component commonly used in a fingerprint identification module is an infrared light filter. A conventional infrared light filter can allow only visible light with wavelengths ranging from 400 nm to 610 nm to completely pass through, and completely absorb infrared light and red light with wavelengths ranging from 620 nm to 1000 nm, and only visible light can be partially used for imaging in an area of the sensor. For example, after light rays emitted from a light source pass through the light filter, red light (with wavelengths ranging from 620 nm to 770 nm) and infrared light (with wavelengths ranging from 750 nm to 1000 nm) may be completely absorbed by the light filter, and only visible light with wavelengths ranging from 400 nm to 610 nm can pass through the light filter, that is, the light filter in the conventional fingerprint identification module cannot perform imaging by utilizing infrared light.

Figure 7:
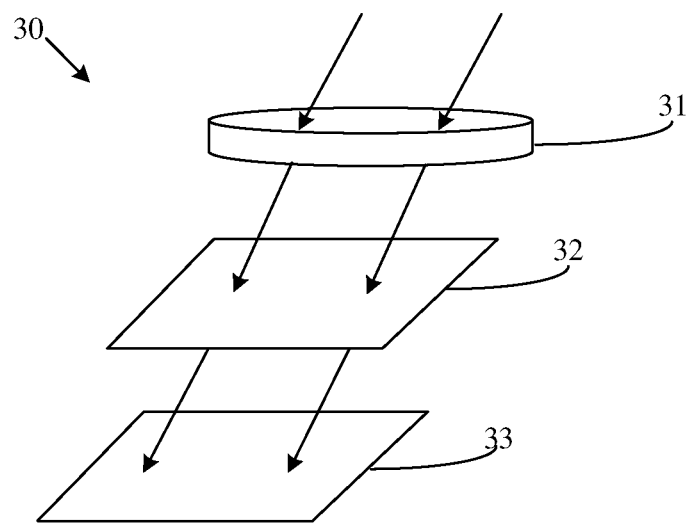
FIG. 7 is a schematic diagram of a light filter in a fingerprint identification module.

FIG. 7 is a schematic diagram of a light filter in a conventional fingerprint identification module. As shown in FIG. 7, the fingerprint identification module 30 includes a lens 31, a light filter 32, and a sensor 33. All areas of the light filter 32 allow visible light with wavelengths ranging from approximately 400 nm to 610 nm to pass through, that is, the light filter 32 has same transmissivity in all areas.

In view of this, this embodiment of the present invention provides a novel light filtering component, which can make penetration intensities of infrared light different in different areas by changing transmissivity of a light filtering layer in different areas. In this way, it is ensured that visible light (may excluding red light) can pass through the light filtering layer while ensuring that part of infrared light can pass through a partial area of the light filtering layer, thereby ensuring that not only visible light but also infrared light can be used in the area for imaging.

Optionally, the light filtering component is a light filtering layer. The light filtering layer may include at least two areas. Each of the at least two areas has different transmissivity. For example, each of the at least two areas has different transmissivity for infrared light, that is, penetration intensities of infrared light in different areas are different.

Optionally, in this embodiment of the present invention, the foregoing at least two areas may include a first area and a second area. The first area is a transparent area for infrared light and visible light whose wavelength is less than that of red light, and the second area is a transparent area for visible light whose wavelength is less than that of red light. In other words, the first area can allow infrared light and visible light whose wavelength is less than that of red light to pass through, and the second area can allow visible light whose wavelength is less than that of red light to pass through.

Figure 8:
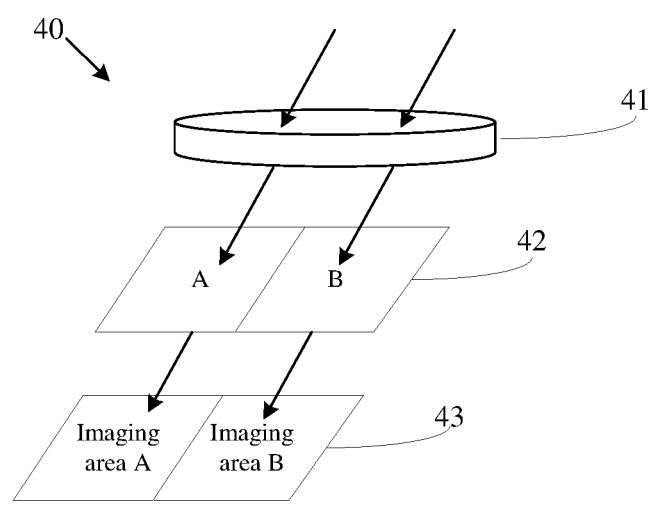
FIG. 8 is a fifth schematic structural diagram of a light filtering component in a fingerprint identification module according to an embodiment of the present invention.

FIG. 8 is a schematic diagram of a light filtering component in a fingerprint identification module according to an embodiment of the present invention. As shown in FIG. 8, the fingerprint identification module 40 includes a lens 41, a light filtering component 42, and an optical sensor 43. The light filtering component 42 is a light filter. The light filtering component 42 includes an area A and an area B. The area A can allow not only visible light with wavelengths ranging from 400 nm to 610 nm but also part of infrared light with wavelengths ranging from 620 nm to 1000 nm to pass through. The area B maintains a characteristic of a conventional infrared light filter and allows only visible light with wavelengths ranging from 400 nm to 610 nm to pass through.

For example, when a complementary light source is in a visible light wavelength band, both the area A and the area B can allow visible light with wavelengths ranging from 400 nm to 610 nm to pass through. Both an imaging area A and an imaging area B of the optical sensor 43 utilize visible light with wavelengths ranging from 400 nm to 610 nm for imaging. When the complementary light source includes visible light with wavelengths ranging from 400 nm to 610 nm and part of infrared light with wavelengths ranging from 620 nm to 1000 nm, the area A can allow visible light with wavelengths ranging from 400 nm to 610 nm and part of infrared light with wavelengths ranging from 620 nm to 1000 nm to pass through. The imaging area A in the optical sensor 43 may utilize both visible light and infrared light for imaging. Therefore, an imaging spectral region of the optical sensor can be expanded, and adaptability of the optical sensor for imaging can be enhanced.

The following describes a light filtering component provided in an embodiment of the present invention with reference to the light regulation processing and light filtering processing of the light filtering component.

Figure 9:
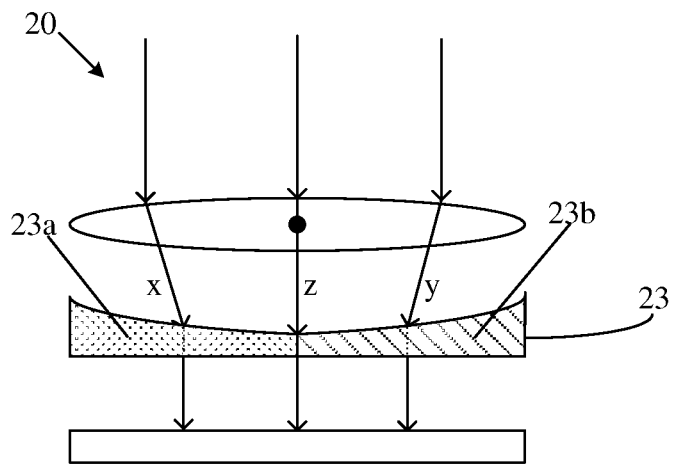
FIG. 9 is a sixth schematic structural diagram of a light filtering component in a fingerprint identification module according to an embodiment of the present invention.

With reference to FIG. 3, as shown in FIG. 9, the light filtering layer 23 includes an area 23a and an area 23b. The area 23a can allow infrared light and visible light whose wavelength is less than that of red light to pass through, and the area 23b can allow visible light whose wavelength is less than that of red light to pass through.

Figure 10:
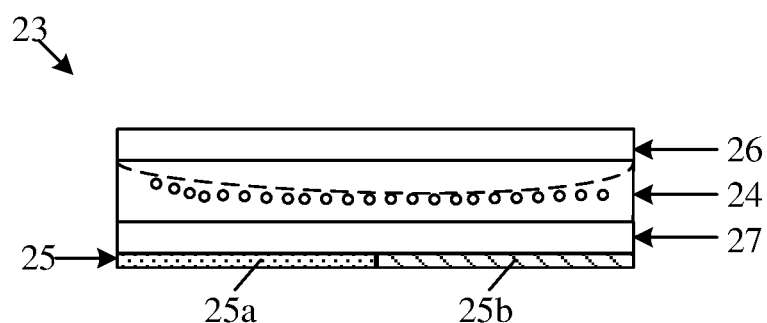
FIG. 10 is a seventh schematic structural diagram of a light filtering component in a fingerprint identification module according to an embodiment of the present invention.

With reference to FIG. 6, as shown in FIG. 10, the light filtering layer 25 includes an area 25a and an area 25b. The area 25a can allow infrared light and visible light whose wavelength is less than that of red light to pass through, and the area 25b can allow visible light whose wavelength is less than that of red light to pass through.

In this embodiment of the present invention, penetration intensities of infrared light in different areas of a light filtering layer are made different by changing transmissivity of the different areas. In this way, it is ensured that visible light (excluding red light) can pass through the light filtering layer while ensuring that part of infrared light can pass through a partial area of the light filtering layer, thereby ensuring that not only visible light but also infrared light can be used in the area for imaging. Therefore, an imaging spectral region of the optical sensor is expanded, and adaptability of the optical sensor for imaging is enhanced.

Figure 11:
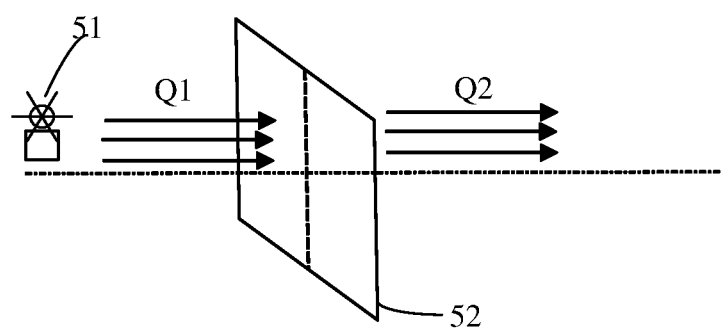
FIG. 11 is a schematic test diagram of transmissivity of a light filtering component according to an embodiment of the present invention.

Optionally, in this embodiment of the present invention, transmissivity of the light filtering component may be adjusted based on an actual imaging effect. FIG. 11 is a schematic test diagram of transmissivity of a light filtering component according to an embodiment of the present invention. As shown in FIG. 11, assuming that an intensity of light emitted from a light source is Q1, and an intensity of the light after passing through the light filtering component 52 is Q2, transmissivity of the light filtering component 52 can be calculated by using the following formula: (Q2/Q1)×100 percent.

It should be noted that, the foregoing description is provided by using an example in which the light filtering layer includes two areas. It may be understood that, during actual implementation, transmissivity of the light filtering layer in different areas may be changed to adjust penetration intensities of infrared light, and there may be two different areas with different transmissivity or more than two different areas with different transmissivity, so as to ensure that different light ray intensities make different utilization rates of infrared light, and meet requirements on spectrums and light intensities in different environments. The infrared light filter may have different thicknesses and concave radians in different areas, and may be in a stepped form gradually changing from the center to the edge. Alternatively, based on the transmissivity of the light filtering layer itself for light, different areas with different transmissivity may correspond to different thicknesses and concave radians, so as to ensure that light rays can reach the optical sensor uniformly and parallelly after passing through the light filtering layer, which not only guarantees a proper fingerprint image brightness in a central area, but also increases a fingerprint image brightness in an edge area.

It should be noted that, all optical fingerprint solutions in which infrared light in an environment is utilized for imaging by changing transmissivity of an infrared light filter fall within the protection scope of the claims.

Figure 12:
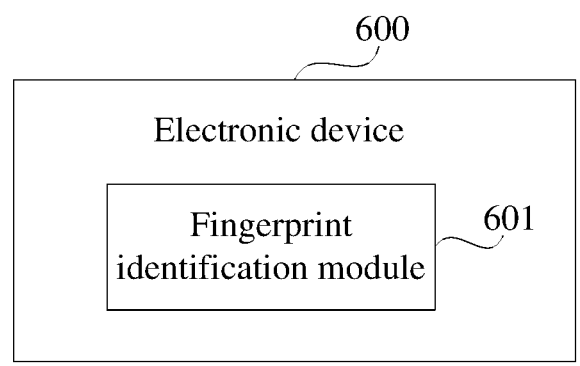
FIG. 12 is a schematic structural diagram of an electronic device according to an embodiment of the present invention.

As shown in FIG. 12, an embodiment of the present invention provides an electronic device 600. The electronic device 600 may include a fingerprint identification module 601. For description of the fingerprint identification module, reference may be made to related description of the fingerprint identification module (for example, the fingerprint identification module 20 and the fingerprint identification module 40) in the foregoing embodiment, and details are not described herein again.

Optionally, in this embodiment of the present invention, the electronic device may further include a touch panel and an organic light-emitting diode (OLED) module, and the fingerprint identification module may be disposed on one side of the OLED module facing away from the touch panel.

A light-emitting unit in the OLED module may be a light source of the fingerprint identification module.

The electronic device provided in this embodiment of the present invention may use the OLED module and the fingerprint identification module to implement under-screen fingerprint identification. The fingerprint identification module includes a lens, an optical sensor, and a light filtering component located between the lens and the optical sensor. An incident direction of a first light ray that enters the light filtering component is different from a refractive direction of the first light ray. The first light ray is any light ray that is of light rays entering the light filtering component and that is different from a second light ray, and the second light ray is a light ray in a normal direction of the light filtering component. In this solution, the fingerprint identification module uses a novel light filtering component. The light filtering component has not only a light filtering function, but also a function of adjusting a propagation direction of light rays that enter the light filtering component. In this way, light rays that reach the optical sensor after being reflected by a finger may be uniformly distributed on the sensor, that is, intensities of light received by the optical sensor in different areas are made approximately the same. Therefore, this embodiment of the present invention can improve quality equilibrium of fingerprint images collected by the optical sensor in different areas, and can increase a success rate of fingerprint identification.

The electronic device in this embodiment of the present invention may be a mobile terminal or a non-mobile terminal. For example, the mobile terminal may be a mobile phone, a tablet computer, a laptop computer, a palmtop computer, an in-vehicle terminal, a wearable device, an ultra-mobile personal computer (UMPC), a netbook, or a personal digital assistant (PDA). The non-mobile terminal may be a personal computer (PC), a television (TV), an automated teller machine or a self-service machine. This is not limited in this embodiment of the present invention.

It should be noted that, in this specification, the terms "include", "comprise", or any of their variants are intended to cover a non-exclusive inclusion, so that a process, a method, an article, or an apparatus that includes a series of elements not only includes those elements but also includes other elements that are not expressly listed, or further includes elements inherent to such a process, method, article, or apparatus. An element limited by "includes a . . . " does not, without more constraints, preclude the presence of additional identical elements in the process, method, article, or device that includes the element.

The embodiments of this application are described above with reference to the accompanying drawings, but this application is not limited to the foregoing implementations. The foregoing implementations are merely schematic instead of restrictive. Under enlightenment of this application, a person of ordinary skills in the art may make many forms without departing from aims of this application and the protection scope of claims, all of which fall within the protection of this application.

What is claimed is:

1. A fingerprint identification module, applied to an electronic device, wherein the fingerprint identification module comprises a lens, an optical sensor, and a light filtering component located between the lens and the optical sensor, wherein the lens comprises a convex lens; and
   a thickness of an edge area of the light filtering component is greater than a thickness of a central area of the light filtering component, and a thickness of the light filtering component decreases gradually along a direction from the edge area to the central area; wherein
   the light filtering component comprises a light adjusting member, and in a case where the fingerprint identification module is in a working state, at least one of a first surface of the light adjusting member facing the lens and a second surface of the light adjusting member facing away from the lens is concave.

2. The fingerprint identification module according to claim 1, wherein incident rays are emitted as a parallel beam of rays after passing through the lens and the light filtering component.

3. The fingerprint identification module according to claim 1, wherein the light filtering component further comprises a light filtering layer, and the light filtering layer is disposed on one side of the light adjusting member.

4. The fingerprint identification module according to claim 3, wherein the light adjusting member is a concave glass lens.

5. The fingerprint identification module according to claim 3, wherein the light adjusting member is a liquid crystal lens.

6. The fingerprint identification module according to claim 5, wherein the light filtering component further comprises a first substrate and a second substrate, and the liquid crystal lens is disposed between the first substrate and the second substrate; and
   the light filtering layer is disposed on a surface of the first substrate or a surface of the second substrate.

7. The fingerprint identification module according to claim 6, wherein the first substrate and/or the second substrate are provided with an electrically conductive wire, and the liquid crystal lens is electrically connected to the electrically conductive wire.

8. The fingerprint identification module according to claim 1, wherein the light filtering component comprises at least two areas, and each of the at least two areas has different transmissivity.

9. The fingerprint identification module according to claim 8, wherein the at least two areas comprise a first area and a second area, the first area is a transparent area for infrared light and visible light whose wavelength is less than that of red light, and the second area is a transparent area for visible light whose wavelength is less than that of red light.

10. An electronic device, wherein the electronic device comprises a fingerprint identification module, and the fingerprint identification module comprises a lens, an optical sensor, and a light filtering component located between the lens and the optical sensor, wherein the lens comprises a convex lens; and
    a thickness of an edge area of the light filtering component is greater than a thickness of a central area of the light filtering component, and a thickness of the light filtering component decreases gradually along a direction from the edge area to the central area; wherein
    the light filtering component comprises a light adjusting member, and in a case where the fingerprint identification module is in a working state, at least one of a first surface of the light adjusting member facing the lens and a second surface of the light adjusting member facing away from the lens is concave.

11. The electronic device according to claim 10, wherein incident rays are emitted as a parallel beam of rays after passing through the lens and the light filtering component.

12. The electronic device according to claim 10, wherein the light filtering component further comprises a light filtering layer, and the light filtering layer is disposed on one side of the light adjusting member.

13. The electronic device according to claim 12, wherein the light adjusting member is a concave glass lens.

14. The electronic device according to claim 12, wherein the light adjusting member is a liquid crystal lens.

15. The electronic device according to claim 14, wherein the light filtering component further comprises a first substrate and a second substrate, and the liquid crystal lens is disposed between the first substrate and the second substrate; and the light filtering layer is disposed on a surface of the first substrate or a surface of the second substrate.

16. The electronic device according to claim 15, wherein the first substrate and/or the second substrate are provided with an electrically conductive wire, and the liquid crystal lens is electrically connected to the electrically conductive wire.

17. The electronic device according to claim 10, wherein the light filtering component comprises at least two areas, and each of the at least two areas has different transmissivity.

18. The electronic device according to claim 10, wherein the electronic device further comprises a touch panel and an organic light-emitting diode (OLED) module, and the fingerprint identification module is disposed on one side of the OLED module facing away from the touch panel.

* * * * *